United States Patent
Nilsson (10) Patent No.: US 10,364,059 B2
(45) Date of Patent: Jul. 30, 2019

(54) METHOD AND DEVICE FOR MAGNETISING A PACKAGE MATERIAL, AND PACKAGING MATERIAL MAGNETISED WITH SAID METHOD

(71) Applicant: TETRA LAVAL HOLDINGS & FINANCE S.A., Pully (CH)

(72) Inventor: Tommy Nilsson, Eslöv (SE)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 50 days.

(21) Appl. No.: 15/513,441

(22) PCT Filed: Sep. 11, 2015

(86) PCT No.: PCT/EP2015/070863
§ 371 (c)(1),
(2) Date: Mar. 22, 2017

(87) PCT Pub. No.: WO2016/045994
PCT Pub. Date: Mar. 31, 2016

(65) Prior Publication Data
US 2017/0297760 A1 Oct. 19, 2017

(30) Foreign Application Priority Data

Sep. 23, 2014 (SE) .................................. 1451124

(51) Int. Cl.
*B32B 3/00* (2006.01)
*B65D 5/42* (2006.01)
(Continued)

(52) U.S. Cl.
CPC .......... *B65D 5/4212* (2013.01); *B31B 70/006* (2017.08); *B31B 70/256* (2017.08);
(Continued)

(58) Field of Classification Search
CPC ...... B65D 5/4212; B65D 5/4287; B65D 5/38; B31B 50/006; B31B 50/88; B31B 50/00;
(Continued)

(56) References Cited

U.S. PATENT DOCUMENTS

| 5,458,062 A | 10/1995 | Goldberg et al. |
| 2005/0287351 A1 | 12/2005 | Johansson et al. |

(Continued)

FOREIGN PATENT DOCUMENTS

| CN | 103221207 A | 7/2013 |
| EP | 7 05 759 A1 | 4/1996 |

(Continued)

OTHER PUBLICATIONS

International Search Report (PCT/ISA/210) dated Jan. 13, 2016, by the European Patent Office as the International Searching Authority for International Application No. PCT/EP2015/070863.

(Continued)

*Primary Examiner* — Elizabeth E Mulvaney
(74) *Attorney, Agent, or Firm* — Buchanan Ingersoll & Rooney PC (57) ABSTRACT

A magnetizing device in a web processing machine for magnetizing a magnetisable area of a web of packaging material is disclosed. The magnetizing device comprises a first magnetic component having a north pole and a south pole, and a second magnetic component having a north pole and a south pole. Poles of a first and same polarity are arranged adjacent in an opposed relationship and poles of a second and the same polarity are arranged remote from each other.

15 Claims, 3 Drawing Sheets

(51) Int. Cl.
*B65D 65/38* (2006.01)
*B65H 18/14* (2006.01)
*B31B 70/00* (2017.01)
*B65H 18/10* (2006.01)
*G01R 33/02* (2006.01)
*G06K 7/08* (2006.01)
*G06K 19/06* (2006.01)
*B31B 50/88* (2017.01)
*B31B 100/00* (2017.01)
*B31B 50/00* (2017.01)
*B31B 155/00* (2017.01)

(52) U.S. Cl.
CPC .......... *B65D 5/4287* (2013.01); *B65D 65/38* (2013.01); *B65H 18/103* (2013.01); *B65H 18/145* (2013.01); *G01R 33/02* (2013.01); *G06K 7/084* (2013.01); *G06K 19/06187* (2013.01); *B31B 50/006* (2017.08); *B31B 50/88* (2017.08); *B31B 2100/00* (2017.08); *B31B 2155/001* (2017.08); *B65H 2301/5131* (2013.01); *B65H 2301/5152* (2013.01); *B65H 2553/22* (2013.01); *B65H 2801/81* (2013.01)

(58) Field of Classification Search
CPC .......... B31B 70/006; B65H 2301/5131; G01R 33/02; G06K 7/084; G06K 19/06187
See application file for complete search history.

(56) References Cited

U.S. PATENT DOCUMENTS

| | | |
|---|---|---|
| 2008/0309327 A1 | 12/2008 | Holmström |
| 2012/0070634 A1 | 3/2012 | Holmström |
| 2013/0228614 A1 | 9/2013 | Bergholtz |

FOREIGN PATENT DOCUMENTS

| | | |
|---|---|---|
| GB | 2 286 822 A | 8/1995 |
| WO | WO 03/095198 A1 | 11/2003 |
| WO | WO 2006/093449 A1 | 9/2006 |
| WO | WO 2010/138049 A1 | 12/2010 |
| WO | WO 2012/072309 A1 | 6/2012 |

OTHER PUBLICATIONS

Written Opinion (PCT/ISA/237) dated Jan. 13, 2016, by the European Patent Office as the International Searching Authority for International Application No. PCT/EP2015/070863.

METHOD AND DEVICE FOR MAGNETISING A PACKAGE MATERIAL, AND PACKAGING MATERIAL MAGNETISED WITH SAID METHOD

TECHNICAL FIELD

The present disclosure relates primarily to a device and method for magnetising a packaging material, and also to a packaging material magnetisable with said method.

BACKGROUND

Within packaging technology where a packaging container is formed from a packaging laminate, it is known to provide the packaging laminate as a web which prior or during packaging is formed to the packaging container. Guiding marks, e.g. for optical reading has been provided to guide operations when finishing the package, such as forming, sealing, folding, etc. Such guiding marks are sometimes referred to as register marks. The register mark for optical reading is provided during printing of the packing laminate, where e.g. decoration or product information is printed on the packaging laminate. A problem with such register marks is that they consume a non-negligible area of what becomes the exterior of the package. A further problem is that such a register mark has to rely on the printing being well aligned with other operations performed on the web. It is therefore a desire to provide an improved provision of marking of web of packaging laminate. A solution to these and other issues have suggested by the present applicant in the form of the provision of magnetic marking of packaging material. Such solutions have been disclosed in several patent applications. The present disclosure will relate to an improved device and method for magnetic marking, and a packaging material having been magnetised with such device and method. To that end the outcome of the present disclosure may be applied to existing schemes or magnetic marking, by providing an improved magnetic marking.

SUMMARY

The present invention is based on the understanding that magnetic marking can be provided on a packaging laminate. A suitable starting point may be WO03/095198 in which it is disclosed how one layer of a packaging laminate may comprise magnetisable particles. In later applications by the same applicant it has been disclosed how only a minor portion of the packaging laminate may be magnetisable as oppose to one entire layer. In the former application it is specified how the magnetisable material may be magnetised in well defined positions (magnetic marks) by magnets arranged in and on a creasing roller. The creasing roller is used in order to apply weakening lines onto the packaging material for facilitating later folding and forming during production of packaging containers from the packaging laminate. The arrangement of the magnets in and on the creasing roller there is a perfect alignment between the magnetic mark and the weakening lines, and by that the magnetic mark may be utilized to localize the weakening lines with a very high accuracy at a later stage. This and several other uses are believed to be well disclosed in prior art. Instead of having the magnets arranged in and on a creasing roller they may be arranged on a roller used for applying a décor onto the packaging laminate, in which case the magnetic mark will be perfectly aligned with the décor, yet still very well-aligned with the weakening lines.

When using the magnetic mark for practical purposes it will have to be read by a sensor arrangement. There are several types of magnetic sensors available yet it is not the purpose of the present specification to make a full disclosure of that technology. Still, when reading a magnetic mark with the intention to obtain information on position a detailed mapping on magnetic field strengths is not necessary, it is sufficient to arrive at a reliable measure in regard of the position. It is therefore common practice to only measure a magnetic flux in a single direction, such as horizontal or vertical and to obtain a measure of how the magnetic flux varies in that single direction. To make use of such a measurement there of course has to be knowledge of how the magnetic field pattern varies over a magnetic mark. Once that is known it may be easy enough to locate a position in which the magnetic flux is zero (in that single direction) and to use that position as defining a fix point.

Storing information in a magnetic recording medium in packing material has been suggested in e.g. EP 705759 A1. In the present disclosure, it is suggested that one or more spots per intended package to be formed from the web is provided on the web, wherein the spots comprises magnetisable particles such that magnetic marking is enabled.

According to a first aspect, there is provided a packaging material comprising a plurality of magnetisable portions thereon comprising at least one spot per package to be formed from the packaging laminate, and at least one preparation feature for enhancing finishing of packages, wherein the at least one preparation feature is aligned with a magnetic mark in the at least one magnetisable portion.

The preparation feature may comprise any of a group comprising crease lines, openings, perforations, package boundary or sealing, beginning of web, end of web, positioning of optical mark, print for package outside.

A distance between an area of a preparation feature and its aligned magnetic mark may be at least 2 mm, preferably at least 5 mm, preferably at least 7 mm, preferably at least 10 mm.

At least one of the spots for each package to be formed may be positioned not more than 20%, preferably between 5 and 15% of the width of the material to form a package from a longitudinal edge of the material to form the package.

The magnetic field pattern may comprise a first magnetic field peak having a first polarity and a second magnetic field peak having a second opposite polarity. The material may define a transversal direction being parallel to an imaginary axis of a roll when a web of the material is spooled, a longitudinal direction perpendicular to the transversal direction, and an imaginary line between a midpoint of the first peak and the second peak of the magnetic field pattern, wherein the magnetic field pattern may be arranged such that the angle between the imaginary line and the longitudinal direction is between −10 and 10 degrees, preferably between −5 and 5 degrees, preferably about 0 degrees. The peaks of the magnetic pattern may have a distribution forming a substantially constant magnetic field along a width of the magnetic pattern in a direction perpendicular to the imaginary line, and forming a strongly decreasing magnetic field outside the width of the magnetic pattern in the direction perpendicular to the imaginary line. The width may be at least 2 mm, preferably at least 4 mm, preferably at least 6 mm.

The magnetic field pattern may comprise a first magnetic field peak having a first polarity and a second magnetic field peak being distributed such that it encircles the first peak and having a second opposite polarity.

DETAILED DESCRIPTION

The present invention is based on the understanding that magnetic marking can be provided on a packaging laminate. A suitable starting point may be WO03/095198 in which it is disclosed how one layer of a packaging laminate may comprise magnetisable particles. In later applications by the same applicant it has been disclosed how only a minor portion of the packaging laminate may be magnetisable as oppose to one entire layer. In the former application it is specified how the magnetisable material may be magnetised in well defined positions (magnetic marks) by magnets arranged in and on a creasing roller. The creasing roller is used in order to apply weakening lines onto the packaging material for facilitating later folding and forming during production of packaging containers from the packaging laminate. The arrangement of the magnets in and on the creasing roller there is a perfect alignment between the magnetic mark and the weakening lines, and by that the magnetic mark may be utilized to localize the weakening lines with a very high accuracy at a later stage. This and several other uses are believed to be well disclosed in prior art. Instead of having the magnets arranged in and on a creasing roller they may be arranged on a roller used for applying a décor onto the packaging laminate, before or after creasing, in which case the magnetic mark will be perfectly aligned with the décor, yet still very well-aligned with the weakening lines. Once applied the magnetic mark may be used to align any downstream process.

When using the magnetic mark for practical purposes it will have to be read by a sensor arrangement. There are several types of magnetic sensors available yet it is not the purpose of the present specification to make a full disclosure of that technology. Still, when reading a magnetic mark with the intention to obtain information on position a detailed mapping on magnetic field strengths is not necessary, it is sufficient to arrive at a reliable measure in regard of the position. It is therefore common practice to only measure a magnetic flux in a single direction, such as horizontal or vertical and to obtain a measure of how the magnetic flux varies in that single direction. To make use of such a measurement there of course has to be knowledge of how the magnetic field pattern varies over a magnetic mark. Once that is known it may be easy enough to locate a position in which the magnetic flux is zero (in that single direction) and to use that position as defining a fix point.

How this approach has been used and how the present disclosure may provide a direct improvement will be described in the following, referring to the appended drawings.

The present text does not have an intention of providing a full disclosure on the subject of magnetism as such, and the drawings provided are merely for explanatory purposes. Still, a short description may facilitate understanding of the drawings. The region around a permanent magnet where magnetic effects can be experienced is called the magnetic field. The field extends outwards from the magnet and gets weaker as the distance from the magnet increases. Magnetic fields may be visualized using magnetic field lines. It is important to remember that these lines are imaginary although they do help us imagine and quantify the magnetic field. The magnetic field lines shown in the drawings of the present disclosure are not a result of detailed modelling or specific empiric studies, they are merely drawn to facilitate the explanation of features believed to be novel in relation to prior art within the relevant field of technology.

Figure 1:
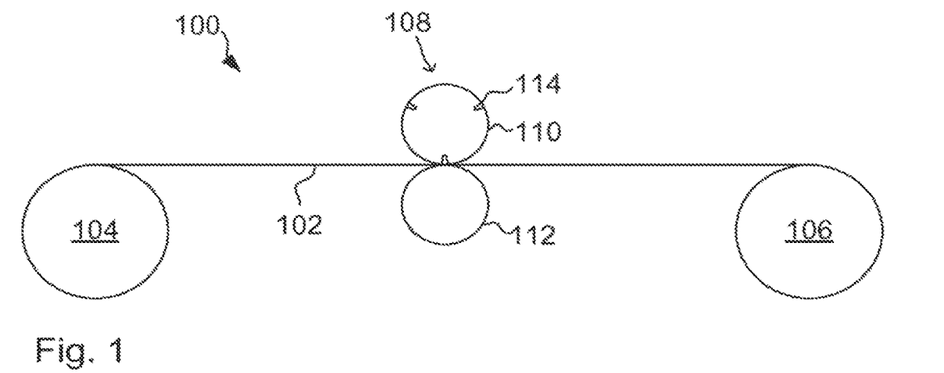
FIG. 1 is a schematic sideview of a web of packaging material being provided with a magnetic marking.

FIG. 1 illustrates a simplified processing line 100 for processing a web 102 of packaging laminate. The web 102 is wound from a first reel 104 to a second reel 106 and a processing station in the form of a creasing unit 108 applies an operation to the web at a position between the reels. In the present example a pattern of weakening lines are applied by the creasing unit 108 as the web of packaging laminate is guided from a the first reel to the second reel. In the simplified embodiments the creasing unit comprises an upper creasing roller 110 and a lower creasing roller 112. The upper creasing roller 110 is provided with magnetising means 114, such as permanent magnets, applying a magnetic field to a magnetisable area (or layer) of the packaging laminate, as the web of packaging material passes the roller. In effect, the magnetising device will be static in relation to the web during magnetisation, i.e. during the time as the web is the closes to the web. For one revolution of the upper creasing roller the creasing pattern for three consecutive packaging containers is formed in a length direction (the direction of movement of the web 102), and this is the reason to why three magnetising means are illustrated distributed around the circumference of the roller 110. Similarly there will be a number of magnetising means arranged in a lateral direction of the roller, corresponding to the number of creasing patterns. In other embodiments the number may vary, yet at least one mark per packaging container is to be expected. Due to the nature of the rotational movement of the roller and the translational motion of the web the approach into the position of magnetisation and away from the same position of magnetisation will be fast compared to the time spent in the magnetising position. The effect will be further enhanced by the induced field strength having a strong dependence on the distance from the magnetising source. If desired the magnetising means may in one or more embodiments be movably arranged, such that a motion towards the web before magnetisation and away from the web after magnetisation, to pronounce the effect even further. Such additional measures are rarely needed. In any of these ways a magnetic mark may be arranged on the packaging laminate. It is of course a given that a magnetisable area of the web 102 will need to be aligned with the magnetising means in order for a magnetic mark to be generated.

Figure 2:
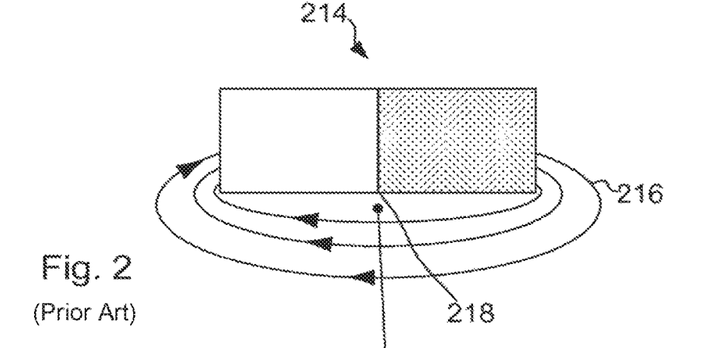
FIG. 2 schematically illustrates a magnetising device according to a prior art embodiment.

FIG. 2 illustrates a first magnetising means 214 (2 referring to FIGS. 2 and 14 referring to the component, a pattern that will recur for other embodiments) which may be used to apply the magnetic mark to the magnetisable area. The application may be easy enough, merely arranging the magnetising means 214 along with and in close proximity to a surface of the packaging laminate, the magnetisable particles will be magnetised induced by the magnetic field generated by the magnetising means. The magnetising means 214 may preferably be oriented parallel to a plane of the packaging laminate and having an imaginary axis extending through the magnetic north and south being parallel to a length direction of the web of packaging laminate. Some imaginary magnetic field lines 216 are illustrated. The view should be quite familiar since it represents the field on one side of a standard bar magnet. A geometrical middle 218 on one side of the magnetising device is also indicated for future reference.

At a later stage the generated magnetic mark is to be read by a sensor, of which there are many different types, as have been discussed already. The sensor will in the present example measure the strength of the magnetic field in a direction parallel to the plane of the packaging laminate in the longitudinal direction of the web of packaging laminate (compare with the direction of the magnetising means), as the web of packaging material passes the sensor. For the present example a response of the sensor is disclosed in the graph of FIG. 3, in a qualitative manner only. Starting from one direction the field strength as indicated by the line 220 will gradually grow in a first direction (the negative direction in the case of FIG. 3). At some point the absolute field strength will start to decrease and eventually shift direction (polarity), corresponding to the first zero crossing in FIG. 3. Thereafter the field strength will grow until it reaches a maximum, which for the simple embodiment of FIG. 2 would correspond to the geometric or constructional middle of the permanent magnet. The second half of the curve will basically correspond to a mirror image of the first; the field strength will decrease, reach a second zero crossing 222 where the field strength shifts direction. Subsequently it will reach a local minimum and fade out, as shown in FIG. 3.

In a practical situation the zero-crossing is preferably used for positioning purposes, rather than using either a local maximum or minimum, since the shift will be readily measured. Notably there are two zero crossings for the embodiment of FIGS. 2 and 3. This may be conveniently solved by using a threshold trigger procedure, where a control unit monitoring the output is programmed to localize the first zero-crossing following a field strength exceeding a certain threshold value, in absolute terms. In this way the first local minimum may be disregarded while the first local maximum exceeds the threshold value and initiates the localisation of the zero-crossing. The threshold value is indicated by the dashed lines in FIG. 3. Thereby it may be ensured that the zero-crossing localised always is the one following the position of the maximum magnetic field strength, the zero-crossing indicated at reference numeral 222.

Figure 3:
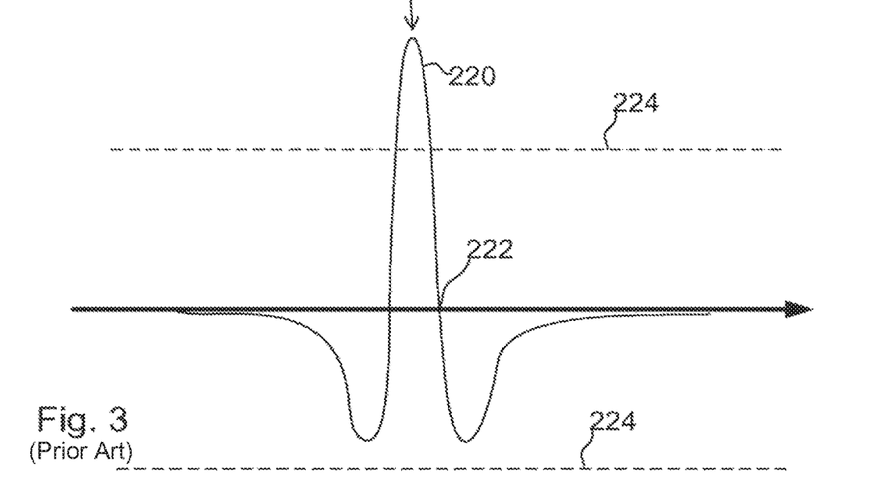
FIG. 3 schematically illustrates a readout from a field-strength sensor measuring the magnetic field strength from the prior art magnetising device.

By comparison of FIGS. 2 and 3 it may be understood that the geometric or constructional middle of the magnet does not coincide with any of the zero-crossings.

Figure 4:
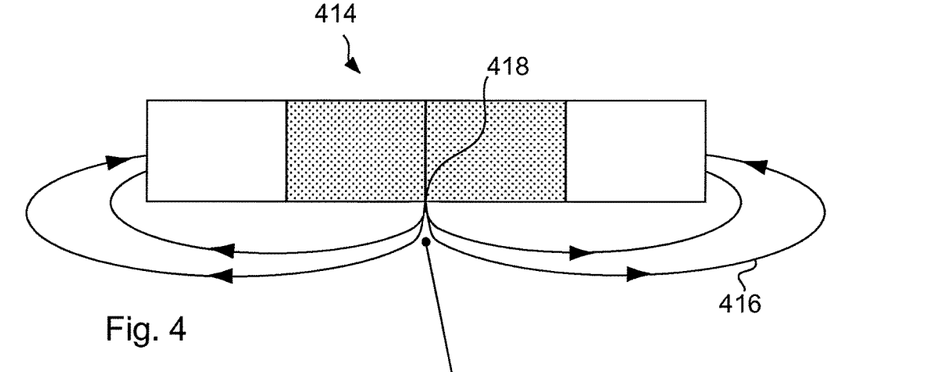
FIG. 4 schematically illustrates a magnetising device according to a first embodiment.
Figure 5:
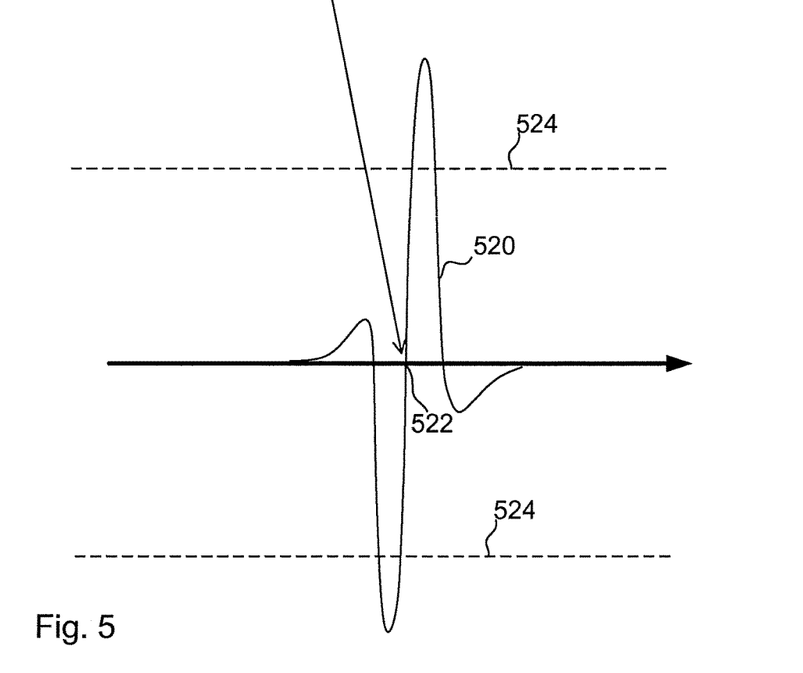
FIG. 5 schematically illustrates a readout from a field-strength sensor measuring the magnetic field strength from the magnetising device of the first embodiment.

Turning now to the present invention, as it is described in reference to FIGS. 4 and 5. FIG. 4 is a schematic view of a magnetising device 414 (compare with FIG. 2), where the magnetic field lines 416 and a geometrical middle 418 indicated. The coloring is used in order to distinguish between north pole and south pole. FIG. 5 is a principle graph illustrating the response 520 from a sensor when measuring the magnetic field strength from the device of FIG. 4 (compare with FIG. 5). In all simplicity the magnetising device comprises two bar magnets arranged in an opposed relationship, such that the two north poles (or south poles) face each other while the two south poles (or north poles) face away from each other. The setup as such would appear to be well known to anyone having experimented with two bar magnets, yet the consequences for the present application are not as apparent. The two magnetic north poles will repel each other which is illustrated by the field lines in FIG. 4. Magnetic field lines, as used in representation of magnetic fields, will not cross and the magnetic field 416 will therefore be distinctly compressed before turning towards the corresponding south pole.

FIG. 5 illustrates the effect of the arrangement as seen via the response 520 of a sensor. Again, as for the case of FIG. 3, the sensor measures the magnetic field strength in a single direction, the horizontal direction and the graph represents the response as the sensor is translated along at a fixed height over the surface of the magnetising device (knowing that the magnetic mark will be an inverted replica of the magnetising means). The situation mimics the case where a magnetised area of a web of packaging material passes a sensor fixedly arranged in a web processing machine or a package processing machine. The new magnetising device will accomplish at least two beneficial effects. The first is that the higher peaks in the graph will be more pronounced than the lower peaks on the sides. This may be compared to the situation of FIG. 3, where the lower peaks on the side are about one third of the absolute height of the higher peak. The measurement curve may be acquired using a single sensor.

The second effect is that there will be a zero-crossing between two pronounced peaks, and that zero-crossing will coincide with the geometrical or constructional middle of the magnetising device. Furthermore the sensor response may be symmetrical as is clearly illustrated in FIG. 5. If a threshold value is set as an absolute level it may be readily ensured that it is the position of the same zero-crossing that is indicated irrespective of whether the sensor moves from left to right or from right to left in relation to the magnetic mark, e.g. if the web of packaging material is forwarded or reversed through a web processing system.

In a situation where the magnetic mark is arranged on a web, and subsequently read out from off the web at a later stage of processing, there is a risk that a distance between the sensor reading the mark and the magnetic mark varies from one measurement to another. In a simplified explanation an increased distance will result in a weaker signal. It is noticeable that irrespective of signal strength the zero-crossing of the setup illustrated by FIGS. 4 and 5 will maintain at the same position in relation to the mark, which also is a benefit of the present disclosure. In an embodiment where the magnetising device is arranged on a roller it may be linearly arranged, such that the magnetic poles line up in the direction of movement of the web of packaging material. The magnetising device may be linear, following a straight line in every direction, yet it may also be slightly curved such as to follow a curvature of the roller in cases where such an arrangement is desired.

Figure 6:
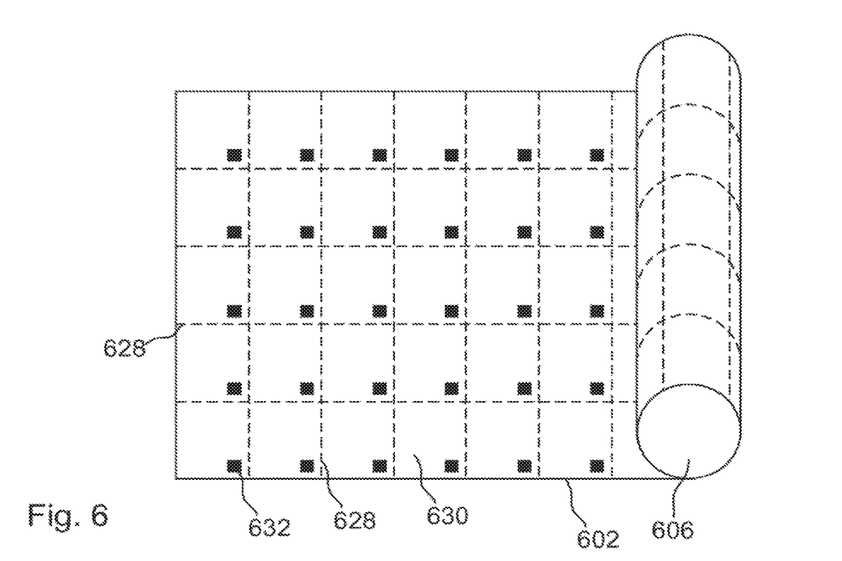
FIG. 6 is a schematic drawing of a web of packaging material provided with magnetic marks.

A suitable packaging laminate may comprise a plurality of magnetisable portions thereon, e.g. in the form of dots or spots, i.e. spots of limited surface area. The web is intended to form a plurality of packages for packaging of e.g. food or liquids. The web may comprise at least one magnetisable portion per package. Thus, when the packages are formed from the packaging laminate, each package will have at least one magnetisable portion each. The spots preferably have any suitable combination of features according to what have been demonstrated above with reference to the geometry, printing, and the magnetisable ink. In FIG. 6, which may be considered being a more detailed view (though still very schematic) of the setup of FIG. 1, downstream the creasing unit. The web 602 has been provided with a creasing pattern 628 indicating what are to become individual packaging containers 630. In a real situation the outermost perimeter of what is to become a packaging container is generally not represented by a crease line, since it mostly is a cut that divides the web into individual containers or narrower webs. Furthermore, the pattern of creasing lines will be more complex. Still, for the sake of illustration, the individual packaging containers are defined by the dashed lines 628, and for each packaging container to be there is an associated magnetisable area 632. If FIG. 6 is a detailed view of FIG. 1 the magnetisable areas have been magnetised at the stage shown in FIG. 6, since it is downstream the creasing unit.

Figure 7:
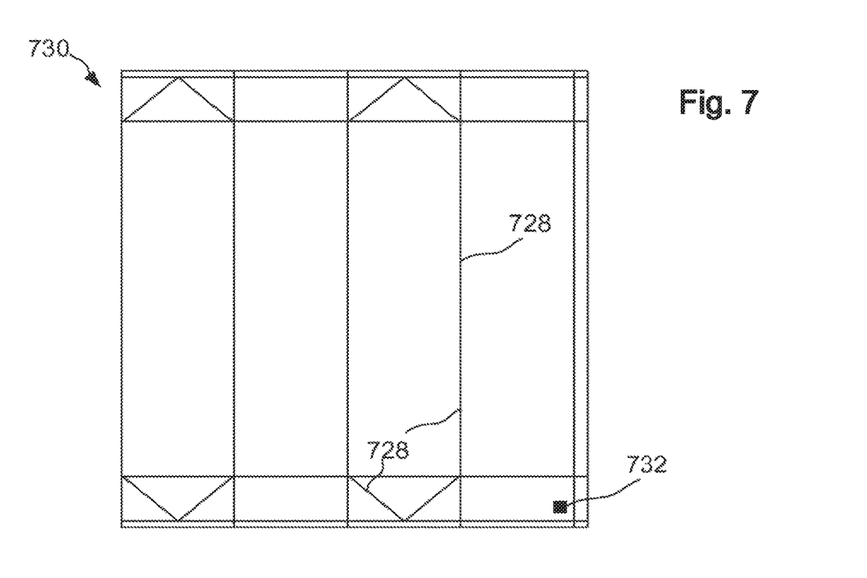
FIG. 7 illustrates a packaging blank.

FIG. 7 illustrates, in all simplicity, an isolated packaging blank 730 with a crease pattern 728 formed from individual creasing lines (represented by each full line within the area of the blank 730). The crease pattern is still a mere example, yet it may make it easier to grasp the even less detailed view of e.g. FIG. 6. A suitable location for a magnetic mark 732 could be the bottom crease pattern, i.e. the crease pattern which when the packaging container has been formed forms a bottom of the packaging container.

The laminate can be a complex laminate comprising a plurality of layers where each layer is selected for providing the final package the desired properties. For example, a further polymer layer can be provided, e.g. to protect the paper layer from moisture, make the final package easier to handle and more rough to exposure from the environment, and/or simply to make the final package have a nicer appearance. The laminate can also comprise a single layer, although denoted as a laminate, if that provides the final package its desired properties, such as a single polymer layer. The laminate can comprise a first layer of paper and a second layer of plastic coating. The magnetisable portions can then be prints, e.g. in form of the spots or other shapes as demonstrated above with reference to the geometry, made on the layer of paper. There can also be further layers, such as a third layer of metal foil. Further or fewer layers of different materials can be provided to give the desired properties of the final package. When the laminate comprises a metal foil layer, it is preferably made of a non-ferromagnetic metal, such as aluminium, such that the magnetisable portion is electromagnetically accessible through the metal foil for printing and reading of the magnetically stored information and/or position. At least some spot of that/those which is/are present on each package may be printed such that it is not visible from outside on the final package. That can for example be for the reason that the exterior of the package should be available for decoration and/or product information. Thus, the print is preferably made on the side of the web intended to face to the interior of the package, or at least on the side of a suitable layer, such as the paper layer as demonstrated above, intended to face towards the interior of the package.

A web of packaging laminate may therefore comprise a plurality of magnetisable portions thereon. The web comprises at least one spot per package to be formed from the packaging laminate. Further, at least one preparation feature for enhancing finishing of packages is provided by the web. The at least one preparation feature is aligned with a magnetic mark in the at least one magnetisable portion. For example, crease lines may be made in the web for enabling a swift and reliable finishing of the package. Upon making the crease lines, a mark, formed as a predefined magnetic field, in the magnetisable portion simultaneously with the making of the crease lines. The mechanism for making the crease lines, i.e. rolls with patterned grooves/protrusions, can be provided with a magnetising element as was mentioned before. The magnetic mark will then be ensured to be aligned with the crease line making operation. The magnetising element can be a permanent magnet, or an electromagnet, for providing the magnetic mark. When the magnet provided at the periphery of a crease roll comes in close vicinity of the magnetisable portion, the magnetisable particles of the magnetisable portion will be magnetised, and a magnetic field pattern will remain at the magnetisable portion. Thus, a magnetic mark is provided. Preferably, the magnetisable portion is slightly larger than the geometric size of the magnetic mark, i.e. the part of the magnetisable portion having a remaining magnetism. Thereby, perfect alignment of the magnetisable portion is not crucial as the magnetic mark will be the element providing an accurate position, and not the print of the magnetisable portion itself.

For reducing the consumption of magnetisable material, e.g. magnetisable ink consumption, the magnetisable portions may be provided as spots or the like at parts where magnetic marks are intended to be positioned. There is a high, still limited precision in positioning between printing and the assignment of the magnetic mark, and therefore the spots are preferably slightly larger than the actual size needed for the magnetic mark. Thus, any reasonable deviation can be handled. The spots are thus provided with magnetisable particles, which can be provided with magnetic marks, and, as will be further elucidated below, depending on the form and size of the spots, be provided with more complex information by modulated magnetisation. The packaging material is preferably a laminate, or a single layer material such as a polymer material.

The packaging laminate may comprise a layer of paper, on which the printing of the magnetisable portions may be made, and one or more layers of plastic coating. Here, the term plastic coating should be construed as any coating including suitable polymers for food containers. The packaging laminate can also comprise a metal foil layer. To be able to write and read the magnetic mark through the metal foil layer, the metal is preferably non-ferromagnetic, such as aluminium.

The print of the magnetisable portions is preferably made on a side of the layer it is printed on of the laminate facing towards the intended interior of the package to be formed. Thus, it does not interfere with exterior printing of e.g. decorations or product information on the package.

The size of a magnetisable areas or spot may be chosen depending on the size of the mark it is supposed to carry. Preferably, the size of the spot is slightly larger to alleviate any problem in positioning deviation between printing of the spot and providing the magnetic mark to it. A larger spot is of course able to carry more magnetisation, which can be used for increasing magnetic field of a low-information carrying mark which thus will be easier to read, especially under harsh signal conditions, or be provided with more complex information, such as carrying information about the web or the particular part of the web. For a low-information carrying mark, the spot can have an area of 250 mm$^2$ or less, which for a square spot equals a side of about 15-16 mm, or a circular spot with a diameter of about 17-18 mm. For many applications, an area of 150 mm$^2$ or less is enough, and for some applications, an area of 25 mm$^2$ or even less may be sufficient. A magnetisable portion for carrying complex data, an elongated spot or bar can be suitable. By providing the elongated portion such that it stretches along a longitudinal direction of the web, sequential writing and reading of the complex data is neatly enabled as the web moves during manufacturing of the web and/or finishing of the packages.

The printed spots preferably comprise an amount of magnetic particles of between 0.5 and 4 g per m$^2$ spot area. Lower amounts may reduce ability to provide the magnetic information, and higher amounts may only increase consumption of magnetisable ink without improving the information carrying abilities. Printing larger amounts may also be a problem, especially at high-speed printing, since the ink may cause problems with setting-off. A preferable amount is between 1.5 and 4 g per m$^2$ to ensure information carrying abilities under various conditions. A fair trade-off of secure reading/writing, printing, and economy in ink consumption gives about 2 g per m$^2$.

The positioning of an elongated spot or bar can be positioned a predetermined distance from a longitudinal border of the web, wherein the data provided in the bar also can be used for alignment of the web in some applications.

The elongated spot or bar can be part of a strip along the web, being piecewise divided such that there is one part present for each package to be formed. The division is preferably positioned such that sealing of the package to be formed is enabled at the position of the division where there is no magnetisable print. The strip can have a magnetic mark indicating the sealing position by being arranged at a predetermined distance from the sealing position.

The "preparation feature" referred to may be other than provision of crease lines, such as providing openings, perforations, etc. The alignment follows the same principle, i.e. that the magnetising portion is provided at the mechanism providing the preparation feature such that the alignment will be inherent because of the structure.

The application of the magnetising element in the mechanism performing the preparation feature may arise a few issues. The magnetising element may for example not be provided at a position where the preparation feature demands a mechanical interaction with the packaging laminate, such as forming a crease line or punching a hole. Therefore, there is preferably provided a distance between an area of such a preparation feature and its aligned magnetic mark. Further, the tool performing the interaction as mentioned above may be made of a ferromagnetic material. To improve the application of the magnetic mark, the magnetising element may need to be provided with a holding or mounting means made of a non-ferromagnetic material, such as aluminium, wherein the distance may be further increased. Thus, depending on the preparation feature operation, and the tool for performing it, the distance is preferably for example at least 5 mm, at least 7 mm, or at least 10 mm.

As several operations performing feature preparations, it is preferable that each such operation have its aligned magnetic mark. Those different magnetic marks may each preferably be made in a respective magnetisable portion adapted in position for the operation. As some operations may be interacting, one operation can use a magnetic mark made by another operation as a master mark, or there may be provided a certain dedicated master mark that is not inherently aligned with any feature preparing operation, which thus only is used for reference by later performed operations.

Other magnetic marks may hold complex data, and can for example be provided as long rectangular spots, i.e. as strips. The strips can be provided along the entire web, with or without interruptions at parts intended to be cut upon finishing the packages. The magnetic marks holding complex data can for example provide a unique code from which the web, and also the part of the web, can be identified. The complex data can also give position information, indications for the finishing of the package, etc.

This magnetic mark may for example be used upon moulding a re-closable opening on the package upon finishing.

A further position information can be package boundary or sealing, where an operation is for dividing the web into the parts forming the package, or for the sealing of respective package.

A further position information, that the magnetisable portion can hold, is magnetic position marks at ends of a web of the packaging material, i.e. beginning of web and/or end of web, such that, at splicing of the webs, the splice is enabled to be aligned.

A further position information is positioning of an optical mark, which may beneficial compatibility for packaging machines having either optical reading or magnetic reading of positioning information. Preferably, the position of the spot holding this information is positioned similar to the optical mark, but on the side that is intended to become the inside of the package. Since the optical mark normally is provided on the part intended to form the bottom of the package, the corresponding magnetisable portion is positioned accordingly. A magnetic mark at this magnetisable portion is thus enabled to provide the similar information as the optical mark, and the optical reader of a packaging machine can thus simply be replaced with a magnetic reader. In practise, no optical mark is thus necessary if the optical readers are replaced by magnetic readers, and the magnetic mark takes the place of the optical mark as described above. In that case, the compatibility lies in the sense of the same mounting position of the readers in the packaging machine.

A further position information can be for a print for the package outside. This position information can be beneficial for ensuring proper alignment of the print with the package, and with other feature preparations of the package.

Upon making the magnetic mark, it can be beneficial that the means for writing the magnetic mark, e.g. a permanent magnet or a coil arrangement, has no or little relative movement, or at least an approximately constant relative movement to the magnetisable portion. This is achieved for example by integrating the writing means in e.g. rolls for making the crease lines, wherein there is no relative movement since the periphery of the rolls and the web moves by the same speed in the same direction. Another way of achieving no or little relative movement or at least an approximately constant relative movement to the magnetisable portion is to control the movement at the position of the writing. This can be done by having a slacking portion of the web both before and after the writing position such that speed at this position can be controlled irrespective of the speed of the web before and after that position. The slack can be achieved by letting the web move along a waveformed path where the sizes of the waves are adaptable to give a variable slack. Thus, during the writing operation, the speed can be controllable at the writing position, and the web is accelerated or decelerated between the writing operations to adapt to the average speed of the web. At least one of the spots for each package to be formed can be positioned not more than 20%, preferably between 5 and 15% of the width of the material to form a package from a longitudinal edge of the material to form the package. A magnetic mark at such spots can then be used for controlling twisting of the material when forming the package. The forming of the package is normally made by forming some kind of tube which then is sealed in some way at its ends and formed into the desired shape. The tube can then be unintentionally twisted, which can jeopardize the forming of the package. Therefore, such a magnetic mark can help to control any twisting of the tube to ensure forming of the package. By having these magnetic marks relatively close to the longitudinal edges to be joined to form the tube, the control is further enhanced since the reading of the magnetic marks can be made from the side of the package where the joining takes place.

Considering a web of packaging laminate comprising a plurality of magnetisable portions thereon, wherein at least one spot per package to be formed from the packaging laminate is comprised, at least one of the magnetisable portions can provide a magnetic mark carrying a magnetic field pattern. Thus, the magnetic mark becomes an information carrier. The information carried is geometrical in the sense that it is made on a particular position on the web, which is maintained through different processing steps, from manufacturing of the web to the finishing of the package. The information can also be in the sense of a pattern of the magnetic field, which can be a rather simple pattern for reliable position detection, or a more complex pattern for carrying complex data.

The invention claimed is:

1. A magnetising device in a web processing machine for magnetising a magnetisable area of a web of packaging material, said magnetising device comprising:
 a first magnetic component having a north pole and a south pole, and
 a second magnetic component having a north pole and a south pole,
 wherein poles of a first and same polarity are arranged adjacent in an opposed relationship, and
 wherein poles of a second and same polarity are arranged remote from each other.

2. The magnetising device of claim 1, wherein the magnetic poles are arranged in a linear arrangement.

3. The magnetising device of claim 1, wherein the magnetising device is configured to arrange the magnetic mark in a longitudinal direction of the web of packaging material, such that the poles are distributed in the longitudinal direction.

4. A packaging material comprising a plurality of magnetisable portions thereon comprising at least one spot per package to be formed from the packaging material, wherein at least one of the magnetisable portions provides a first magnetic mark carrying a magnetic field pattern and wherein the magnetic pattern of the first magnetic mark is represents data or a position on the packaging material, wherein the magnetic field pattern comprises a first magnetic component having a north pole and a south pole, and a second magnetic component having a north pole and a south pole, wherein poles of a first and same polarity are arranged adjacent in an opposed relationship and wherein poles of a second and the same polarity are arranged remote from each other.

5. The packaging material of claim 4, wherein the magnetic poles are arranged in a linear arrangement.

6. The packaging material of claim 4, wherein the packaging material is formed from a web of packaging material and wherein the magnetic mark is arranged in a longitudinal direction of the packaging material, such that the poles are distributed in the longitudinal direction.

7. The packaging material of claim 4, wherein at least one of the magnetisable portions provides a second magnetic mark carrying a magnetic field pattern aligned with at least one preparation feature for enhancing finishing of packages.

8. The packaging material of claim 7, wherein the preparation feature comprises any of a group comprising crease lines, openings, perforations, package boundary or sealing, beginning of a web or sheet of the packaging material, end of a web or sheet of the packaging material, positioning of optical mark, compression or print of a decor element of a package to be formed from the packaging material.

9. The packaging material of claim 4, wherein the magnetisable portions contain a magnetisable ink, comprising magnetisable particles; a solvent; and a binder to disperse the magnetisable particles and to ensure adhesion to the packaging material.

10. The packaging material of claim 6, wherein said first and second peaks of the magnetic pattern have a distribution forming a substantially constant magnetic field along a width of the magnetic pattern in a direction perpendicular to the longitudinal direction, and forming a strongly decreasing magnetic field outside the width of the magnetic pattern in the direction perpendicular to the longitudinal direction.

11. The packaging material of claim 10, wherein the width is at least 2 mm.

12. The packaging material of claim 10, wherein the width is at least 4 mm.

13. The packaging material of claim 10, wherein the width is at least 6 mm.

14. The magnetising device of claim 1, wherein the magnetising device is configured such that a zero crossing of a magnetic field strength will appear at a location corresponding to a constructional middle of the magnetizing device.

15. The packaging material of claim 4, wherein the plurality of magnetisable portions are configured such that a zero crossing of the magnetic field pattern will appear at a location corresponding to a geometric middle of the plurality of magnetisable portions.

* * * * *